United States Patent [19]

Schornick et al.

[11] Patent Number: 4,590,144
[45] Date of Patent: May 20, 1986

[54] PHOTOPOLYMERIZABLE RECORDING MATERIAL AND THE PRODUCTION OF RELIEF PLATES USING THIS RECORDING MATERIAL

[75] Inventors: Gunnar Schornick, Hettenleidelheim; Mong-Jon Jün, Speyer; Axel Sanner, Frankenthal; August Lehner, Roedersheim-Gronau; Werner Lenz, Bad Durkheim; Peter Richter; Albrecht Eckell, both of Frankenthal, all of Fed. Rep. of Germany

[73] Assignee: BASF Aktiengesellschaft, Fed. Rep. of Germany

[21] Appl. No.: 630,833

[22] Filed: Jul. 13, 1984

Related U.S. Application Data

[63] Continuation of Ser. No. 400,700, Jul. 22, 1982, abandoned.

[30] Foreign Application Priority Data

Aug. 18, 1981 [DE] Fed. Rep. of Germany ....... 3131766

[51] Int. Cl.$^4$ .......................... G03C 1/70; G03C 1/71; G03F 7/10
[52] U.S. Cl. .................................... 430/273; 430/284; 430/287; 430/906; 430/306; 522/90
[58] Field of Search ............... 430/284, 287, 906, 273, 430/306; 204/159.15, 159.19

[56] References Cited

U.S. PATENT DOCUMENTS

| | | | |
|---|---|---|---|
| 2,948,611 | 8/1960 | Barney et al. | 96/35 |
| 3,658,531 | 4/1972 | Kurtz | 96/36.3 |
| 3,782,961 | 1/1974 | Takahashi et al. | 204/159.15 |
| 3,948,665 | 4/1976 | Richter et al. | 204/159.19 |
| 4,057,431 | 11/1977 | Finelli et al. | 204/159.19 |
| 4,078,015 | 3/1978 | Leitheiser et al. | 260/859 R |
| 4,221,646 | 9/1980 | Finelli et al. | 204/159.19 |
| 4,334,034 | 6/1982 | Lehner et al. | 204/159.19 |
| 4,387,139 | 6/1983 | Herwig et al. | 430/284 |

FOREIGN PATENT DOCUMENTS 1481472 7/1977 United Kingdom .
1539789 2/1979 United Kingdom .

Primary Examiner—Richard L. Schilling
Attorney, Agent, or Firm—Keil & Weinkauf

[57] ABSTRACT

A photopolymerizable recording material for the production of relief plates comprises a photopolymerizable layer which can be developed in an alcoholic solution and contains a mixture of a photoinitiator, a photopolymerizable monomer and a linear, high molecular weight polyurethane which possesses activated double bonds in side branches, and is prepared using a polyether-diol from the group comprising the polyethylene glycols, propylene glycols and ethylene glycol/propylene glycol co-condensates.

13 Claims, No Drawings

PHOTOPOLYMERIZABLE RECORDING MATERIAL AND THE PRODUCTION OF RELIEF PLATES USING THIS RECORDING MATERIAL

This is a continuation of application Ser. No. 400,700, filed July 22, 1982, now abandoned.

The present invention relates to a photopolymerizable recording material comprising a photopolymerizable layer which is applied to a base and can be developed in an alcoholic solvent, the said layer containing a photopolymerizable, ethylenically unsaturated, low molecular weight compound and a photopolymerization initiator, with or without other conventional additives, and, as the binder, a polyurethane with photopolymerizable double bonds. The invention further relates to processes for the production of relief plates, eg. printing plates and photoresists, using this photopolymerizable recording material.

It is known that relief printing plates or photoresists can be produced photochemically by imagewise exposure of a photopolymerizable layer, applied to a base, by means of a radiation source, in particular actinic light, and developing the exposed photopolymerizable layer by treating it with a solvent in which the unexposed areas of the layer are soluble or at least dispersible, while the exposed areas are not. The photopolymerizable layer of a recording material of this type in general contains low molecular weight photopolymerizable compounds, photoinitiators and a polymeric binder which is also photopolymerizable or photocrosslinkable. The requirements which such photopolymerizable recording materials and in particular the polymeric binder of the photopolymerizable layer have to meet are known from the relevant literature. Nowadays it is desirable to provide photopolymerizable recording materials which not only possess adequate mechanical properties and printing properties, but can be developed with solvents which do not pollute the environment and are not unpleasant to handle.

Photopolymerizable recording materials which contain a polyurethane as the binder in the photopolymerizable layer have proved advantageous in various respects, in particular for printing with oil-based inks. Thus, many photopolymerizable mixtures suitable for the production of printing plates have been described which contain a polyurethane, or polyurethane prepolymer, having acrylate double bonds at the end of the polyurethane chain, together with a photoinitiator and with or without other photopolymerizable compounds (cf., for example, German Laid-Open Application Nos. DOS 2,115,373, DOS 2,427,494, DOS 2,607,257, DOS 2,641,189 and DOS 2,917,748, and U.S. Pat. No. 4,078,015). Provided certain polyether-urethanes having terminal acrylated double bonds are used, it is also possible to obtain photopolymerizable mixtures which can be developed with water or with an aqueous-alkaline medium (cf. German Laid-Open Application Nos. DOS 2,115,373, DOS 2,607,259 and DOS 2,917,748). While German Laid-Open Application Nos. DOS 2,641,189 and DOS 2,917,748 describe the use of low molecular weight liquid polyether-urethanes having terminal acrylate double bonds, German Laid-Open Application Nos. DOS 2,115,373 and DOS 2,427,494 and U.S. Pat. No. 4,078,015 propose the use of low molecular weight polyurethanes which have terminal acrylate double bonds and which, though solid and dry at room temperature, form low-viscosity liquids at an elevated temperature.

These conventional photopolymerizable mixtures based on polyurethanes having terminal acrylate double bonds suffer, however, from the disadvantage that the polyurethanes are of very low molecular weight in order to achieve in the photopolymerizable mixture the high content of double bonds which is required for hardening by polymerization, and that accordingly the photopolymerizable mixtures do not satisfy all desirable mechanical requirements.

U.S. Pat. Nos. 2,948,611 and 3,658,531 and German Laid-Open Application No. DOS 2,300,371 disclose the use, for the production of flexible printing plates, of photopolymerizable materials which contain polyurethane elastomers, with allyl or vinyl groups in side branches, as a basic component. Compared to the low molecular weight polyurethanes with terminal acrylate double bonds, the polyurethanes with vinyl groups in side branches are distinguished by the fact that the number of polymerizable unsaturated groups in the polyurethane molecule can be varied for a given molecular weight, thus making it possible to employ products of higher molecular weight while nevertheless achieving a sufficiently high number of double bonds for photopolymerization. A disadvantage of the processes, for the production of flexible printing plates, described in U.S. Pat. Nos. 2,948,611 and 3,658,531 and in German Laid-Open Application No. DOS 2,300,371 is that these plates, after exposure, can be washed out only with solvents or solvent mixtures, for example methyl ethyl ketone, dimethylformamide, dioxane or tetrahydrofuran, which pollute the environment and are unpleasant to handle. Moreover the exposure characteristics of these plates, and in many cases also their mechanical properties and properties in use, are not entirely satisfactory.

It is an object of the present invention to provide a photopolymerizable recording material which contains a polyurethane-based photopolymerizable layer which is soluble or at least dispersible in an alcoholic developer, and which is easily produced, easy to handle even before exposure and easily processible, has very little cold flow and, in particular, very little tendency to become brittle. It is a further object of the invention to provide a recording material which is suitable for the production of relief printing plates, in particular elastomeric relief printing plates, and accordingly has good exposure characteristics, high resolution, good printing characteristics after exposure and development, and can be re-used a large number of times.

We have found that these objects are achieved, and that recording materials which can be developed with alcohol and which possess very good mechanical properties and properties in use can be obtained, when the photopolymerizable layer contains, as the binder, a special polyurethane, described below, which does not possess quaternary and/or quaternizable nitrogen atoms.

Accordingly, the present invention relates to a photopolymerizable recording material comprising a base A and a photopolymerizable layer B directly or indirectly bonded firmly thereto, with or without a top layer and/or cover sheet C, the photopolymerizable layer B comprising 1. a solvent-soluble polyurethane having photopolymerizable double bonds, as the polymeric binder, 2. one or more photopolymerizable, ethylenically unsaturated, low molecular weight compounds, and 3. a photopolymerization initiator, with or without 4. other conventional additives, wherein the photopolymerizable layer B contains, as the binder (component B1) a substantially linear, high molecular weight, thermoplastic polyurethane which is solid at room temperature, does not possess any quaternary and/or quaternizable nitrogen atoms, and is obtained by reacting a mixture of (a) from 10 to 40% by weight of a diisocyanate, (b) from 30 to 85% by weight of a polydiol comprising from 50 to 100% by weight, based on the polydiol component (b), of one or more polyetherdiols, having a molecular weight of from 250 to 4,000, from the group comprising the polyethylene glycols, polypropylene glycols and ethyleneglycol/propyleneglycol co-polycondensates, and from 0 to 50% by weight, based on the polydiol component (b), of one or more further compatible polydiols, (c) from 0.1 to 20% by weight of a chain-extending compound which is bifunctionally reactive towards isocyanates and possesses activated photopolymerizable double bonds in side branches, and (d) from 0 to 20% by weight of another low molecular weight chain extender, each of the above percentages of the components of the reaction mixture being based on the sum of the components (a), (b), (c) and (d), and the NCO/OH plus NH molar ratio provided by the reactants being from about 0.8 to 1.3.

The invention further relates to specific embodiments of this photopolymerizable recording material, as described in detail below. The invention also relates to processes for the production of relief plates, for example of oil-resistant relief printing plates, especially oil-resistant elastomeric relief printing plates, or of photoresists, using the photopolymerizable recording material.

It was surprising that the use of the novel polyurethanes as binders should give photopolymerizable recording materials which have very good overall properties and have a number of special advantages, and which are suitable for the production of relief printing plates or photoresists. Thus, the polyurethanes, even in the initial state, possess high tear strength, good tensile and flexural characteristics and good resilience, so that even before exposure the materials have excellent mechanical properties and the performance characteristics of the exposed materials in respect of, for example, resilience and hardness can be set to the desired order without having, in return, to accept disadvantages, for example embrittlement or low aging resistance. Since the photopolymerizable layer possesses very good gelling characteristics, the photopolymerizable recording materials can be readily and advantageously produced by casting from solution. They possess excellent exposure characteristics, and the relief printing plates produced from them have good mechanical properties and good properties in use.

The polyurethanes employed as component B1 in the novel photopolymerizable recording materials are substantially linear, solid at room temperature, and in general non-tacky. At the same time, they should have a high molecular weight, and accordingly they generally have K values (as defined by Fikentscher, Cellulosechemie 13 (1932), 58) of from 25 to 75, preferably from about 35 to 65. The photopolymerizable double bonds present in the polyurethanes (B1) employed according to the invention are in side branches of the polyurethane main chain, ie. in a side group, which is bonded to the polymer main chain. They are activated carbon-carbon double bonds which are, advantageously, in the terminal position of side groups; the groups concerned are, in particular, acryloyl and/or methacryloyl groups. The content of photopolymerizable double bonds in side branches of the polyurethane (B1) is from 0.01 to 2.5% by weight, based on the weight of polyurethane. The double bond content chosen depends not only on the reactivity of the double bonds but also on the desired degree of crosslinking after exposure and, associated therewith, on the desired pattern of properties of the recording material. We have found that it is advantageous if the polyurethane (B1) contains not less than 0.05% by weight, based on the weight of polyurethane, of photopolymerizable double bonds in side branches. Depending on the nature and end use of the photopolymerizable recording material, it is advantageous if the content of photopolymerizable double bonds in side branches of the polyurethane (B1) does not exceed 2% by weight, taking the weight of a carbon-carbon double bond as 24.

The polyurethanes (B1) employed as binders in the photopolymerizable layer B can be prepared in a conventional manner by reacting a diisocyanate, an appropriate polydiol and a suitable olefinically unsaturated compound having two hydrogen atoms which are reactive towards isocyanates, with or without other low molecular weight diols, diamines or amino alcohols conventionally used in the preparation of polyurethanes and serving as chain extenders. The details which follow may be noted with regard to the components from which the polyurethanes (B1) are synthesized according to the invention.

Suitable diisocyanates are the conventional compounds known from polyurethane chemistry; they may be employed singly or as mixtures with one another. In principle, any desired aliphatic, cycloaliphatic, araliphatic, aromatic or heterocyclic diisocyanates can be used. Specific examples are 4,4'-diphenylmethylene diisocyanate, dicyclohexylmethane diisocyanate, 1,5-naphthylene diisocyanate, 2,4- and 2,6-toluylene diisocyanate, hexamethylene diisocyanate, isophorone diisocyanate and trimethylhexamethylene diisocyanate. Other suitable diisocyanates include 4,4'-dibenzyl diisocyanate, 1,3- and 1,4-phenylene diisocyanate, cyclohexane 1,4-diisocyanate, xylylene diisocyanates, halogenated diisocyanates, eg. 4-chloro-1,3-phenylene diisocyanate and the hydrogenation products of aromatic diisocyanates, eg. 1,5-tetrahydronapthylene diisocyanate. Aliphatic or cycloaliphatic diisocyanates are preferably used. In preparing the polyurethanes (B1), the diisocyanates are employed in amounts which correspond to a content, in the polyurethane, of from 10 to 40% by weight, in particular from about 15 to 30% by weight.

Suitable polydiols for the synthesis of the polyurethane (B1) employed according to the invention are the conventional substantially linear polyether-diols from the group comprising the polyethylene glycols, polypropylene glycols and ethylene glycol/propylene glycol co-condensates, the latter preferably containing from 10 to 90% by weight, based on the co-polycondensate, of propylene oxide. The molecular weight of these polyether-diols is in general from 250 to 4,000, preferably from about 500 to 2,000. To prepare the polyurethanes (B1) employed according to the invention, the said special polyether-diols are preferably employed alone or as a mixture with one another, but may also be used as a mixture with other compatible polydiols, these last-mentioned mixtures containing not more than 50% by weight, based on the mixture of the polydiols, of the further polydiols.

Further suitable diols which may be used as a mixture with the said special polyether-diols are the conventional substantially linear polyester-diols, other polyether-diols, polylactone-diols and polycarbonate-diols. In addition to the terminal hydroxyl groups, polydiols may or may not contain small amounts of carboxyl, amino or mercapto groups. Suitable polyester-diols are, in particular, saturated polyester-diols, for example the products obtained by esterifying dicarboxylic acids, in particular adipic acid, with $C_2$-$C_{10}$-alkanediols or oxaalkanediols of 2 to 6 carbon atoms. Specific examples of polyester-diols are adipates of glycol (molecular weight about 2,000), of diethylene glycol (molecular weight about 2,000), of butane-1,4-diol (molecular weight 940), of hexane-1,6-diol (molecular weight 1,000), of a 1:1 hexane-1,6-diol/butane-1,4-diol mixture (molecular weight 1,000 or 2,000) and of 2,2-dimethylpropane-1,3-diol (molecular weight 1,000). Suitable polycarbonate-diols are, for example, hexanediol polycarbonates. Typical polylactone-diols are polycaprolactone-diols (molecular weight 830 or 2,000). Examples of other suitable polyether-diols are polymers of tetrahydrofuran or butylene oxide.

In preparing the polyurethanes (B1), the polydiols are employed in amounts corresponding to a content in the polyurethane of from about 30 to 85% by weight, in particular from about 50 to 80% by weight.

The photopolymerizable double bonds in side branches are introduced into the polyurethanes (B1) employed according to the invention by using, in the preparation of the polyurethane, chain extenders which possess activated double bonds in side branches. Examples of suitable chain extenders having activated double bonds are unsaturated carboxylic acid ester-diols. These may be, for example, reaction products of dicarboxylic acids with polymerizable olefinically unsaturated glycidyl compounds, such compounds being described, for example, in German Laid-Open Application No. DOS 2,164,386. However, the reaction products of epoxide compounds with polymerizable olefinically unsaturated carboxylic acids are equally useful. Reaction products of epoxides with α,β-unsaturated monocarboxylic acids, in particular acrylic acid and/or methacrylic acid, have proved particularly advantageous. The epoxides can be monoepoxides bearing OH groups, eg. glycidol, but can also be epoxides having two terminal epoxide groups. Particularly preferred products are those which are obtained by reacting acrylic acid and/or methacrylic acid with a diepoxide, and which have the general formula (I)

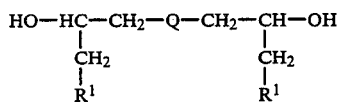

where $R^1$ is ($CH_2$=$CR^2$—CO—O—), $R^2$ being hydrogen or methyl, and Q is —O—; —O—$(CH_2)_m$—O; —O—$(CH_2$—$CH_2$—O—$)_n$; —O—$(CHCH_3$—$CH_2$—O—$)_p$, m, n and p being independent integers from 1 to 10, preferably from 1 to 7, or a radical of the general formula (II)

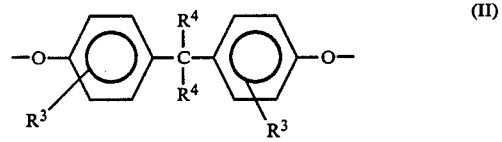

where $R^3$ and $R^4$ are each hydrogen or alkyl of 1 to 10 carbon atoms, eg. methyl, ethyl, propyl, butyl or hexyl.

The reaction of the epoxide compound with the polymerizable olefinically unsaturated carboxylic acid is a ring-opening esterification between the epoxide group of the diepoxy compound and the carboxyl group of the carboxylic acid, which can be carried out in a conventional manner, for example similarly to the procedure disclosed in German Laid-Open Application No. DOS 2,164,386 (cf. also U.S. Pat. Nos. 3,373,075 and 2,824,851). The above epoxide compounds and their reaction products can be employed individually or as mixtures with one another. Preferred materials for the purposes of the invention are reaction products of bisphenol-A-diglycidyl ether (eg. ®Epikote 828 from Shell) or 2,3-epoxypropan-1-ol(glycidol) with acrylic acid and/or methacrylic acid.

The unsaturated carboxylic acid ester-diols, in particular the reaction products of acrylic acid and/or methacrylic acid with epoxide compounds, have molecular weights of from 146 to 3,000.

A further group of chain extenders with activated double bonds in side branches comprises bis-acrylamide or bis-methacrylamide derivatives which have 2 hydrogen atoms which are reactive towards isocyanate, as are formed, for example, in the reaction of acrylamide or methacrylamide with a dialdehyde.

The chain extenders with activated double bonds in side branches should be essentially bifunctional in respect of the subsequent reaction with the diisocyanates. If they have a functionality greater than 2 in respect of reaction with isocyanate groups, excessive branching of the polyurethane molecule, or even crosslinking, may occur. They are employed in the preparation of the polyurethanes (B1) in general in an amount of from 0.1 to 20% by weight, in particular from about 0.5 to 15% by weight, based on the reaction mixture.

In addition to the compounds mentioned, other low molecular weight diols, diamines or amino alcohols, with molecular weights of from 60 to 400, can be employed as chain extenders in the preparation of the polyurethanes (B1) used according to the invention. The use of such additional chain extenders depends, on the one hand, on the chosen starting compounds and desired molecular weight, but, on the other hand, also on the desired properties of the polyurethane and of the recording material. For example, urea groups in the polyurethane, such as are formed, for example, when diamines or amino alcohols are used as chain extenders, give relatively hard products. Preferred chain extenders are low molecular weight diols, for example the conventional saturated or unsaturated glycols, eg. ethylene glycol and its condensates, butanediol, propane-1,2-diol, propane-1,3-diol, neopentylglycol, hexane-1,6-diol, decane-1,10-diol, dihydroxyethoxyhydroquinone, butenediol, dimethylolnorbornene or dimethylolcyclohexane, and these are employed in amounts of from 1 to 20% by weight, in particular from 1 to 10% by weight.

The polyurethanes can be prepared under conventional mass polyaddition or solution polyaddition conditions, as disclosed in the literature. In general, the individual components are employed in a ratio which corresponds to an NCO/OH plus NH molar ratio of from about 0.8 to 1.30, in particular from about 0.9 to 1.2.

Advantageously, the polyurethanes are prepared in solution. For this, any desired solvent which does not react with the polyurethane and with the reactants can be employed. Preferred solvents are hydrocarbons, halohydrocarbons, ketones, ethers, esters and nitriles, eg. acetone, methyl ethyl ketone, acetonitrile, ethyl acetate, methylene chloride, chloroform, carbon tetrachloride, dimethylformamide, dimethylsulfoxide, tetrahydrofuran, dioxane and t-butanol. Mixtures of these solvents can, of course, also be used. The conventional one-stage or multi-stage methods for the preparation of polyurethanes in solution can be employed.

The polyaddition can be carried out with or without a catalyst. Examples of suitable catalysts are tertiary amines, eg. triethylenediamine, metal salts, eg. calcium acetate, and organic compounds of metals, eg. dibutyltin dilaurate and tin octoate. These catalysts are employed in particular in amounts of from 0.001 to 0.5% by weight, based on the polymer.

Component (B1) of the photopolymerizable layer B of the recording material can contain, alongside the polyurethanes described above and employed according to the invention, other, conventional, polymeric binders which are compatible with the polyurethanes in question. Examples of such additional binders which may be present alongside the polyurethanes employed according to the invention in the photopolymerizable layer B are other polyurethanes and modified or unmodified polyvinyl alcohols or vinyl alcohol polymers. The polyurethanes employed according to the invention should account for from 60 to 100% by weight of the total binder (component B1). Preferably, the polyurethanes employed according to the invention are used as the sole binder in the photopolymerizable layer B of the recording material.

The photopolymerizable layer B of the recording material contains, in addition to the polymeric binder (component B1), one or more photopolymerizable, ethylenically unsaturated compounds (component B2) and one or more photopolymerization initiators (component B3), with or without other, conventional additives (component B4).

Suitable photopolymerizable, ethylenically unsaturated, low molecular weight compounds (component B2) are the conventional monomers and/or oligomers (with molecular weights of not more than 5,000, preferably of not more than 3,000) usually employed for photopolymerizable recording materials of the type in question. The photopolymerizable, ethylenically unsaturated compounds (component B2) should of course be compatible with the polymeric binder (component B1) and should in general boil above 100° C. under atmospheric pressure. The photopolymerizable, ethylenically unsaturated compounds (component B2) can be monofunctional or polyfunctional, ie. they can possess one or more carbon-carbon double bonds capable of photoinitiated polymerization. The photopolymerizable, ethylenically unsaturated compounds (component B2) can be employed individually or as mixtures with one another. Preferably, polyfunctional compounds of this type are employed in the photopolymerizable recording material; for certain applications, it is advantageous to use, as component (B2), a combination of monofunctional and polyfunctional, in particular of monofunctional and bifunctional, photopolymerizable, ethylenically unsaturated compounds. The nature and amount of the photopolymerizable, ethylenically unsaturated compounds employed (component B2) of course depends on the polymeric binder (component B1) used with them, and in particular on the nature and end use of the photopolymerizable recording material, ie. on its desired pattern of properties. For example, polyfunctional, rapidly crosslinking, photopolymerizable, ethylenically unsaturated compounds are advantageously used as component (B2) for the production of relief printing plates for letterpress and jobbing work; on the other hand, for recording materials intended for the production of elastomeric relief printing plates, suitable components (B2) are, inter alia, mixtures of monofunctional and polyfunctional photopolymerizable monomers and/or oligomers.

The ratio of the polymeric binder (component B1) to the photopolymerizable, ethylenically unsaturated, low molecular weight compounds (component B2) in the photopolymerizable layer B can be varied within wide limits. In general, from about 95 to 50% by weight of polymeric binder (component B1) and from 5 to 50% by weight of photopolymerizable, ethylenically unsaturated compounds (component B2) are used. Preferably, in particular for the production of elastomeric relief printing plates, the proportions are about 90–60% by weight of polymeric binder (component B1) and from 10 to 40% by weight of photopolymerizable, ethylenically unsaturated compounds (component B2), these percentages being based on the sum of components (B1) and (B2). If component (B2) is a mixture of monofunctional and polyfunctional photopolymerizable, ethylenically unsaturated compounds, the proportion of the monofunctional photopolymerizable, ethylenically unsaturated compounds therein is in general from 5 to 50% by weight, in particular from 5 to 30% by weight.

Suitable photopolymerizable, ethylenically unsaturated compounds which can be employed as component (B2) in the novel photopolymerizable recording materials are described, inter alia, in U.S. Pat. Nos. 2,760,863 and 3,060,203. Examples of suitable compounds are vinyl ethers of alcohols, eg. octadecyl vinyl ether and butane-1,4-diol divinyl ether. Advantageous compounds to use are derivatives, for example esters or amides, of unsaturated carboxylic acids, such as acrylic acid or methacrylic acid, including, inter alia, the acids themselves, acrylamide, methacrylamide, the N-hydroxyalkylacrylamides and N-hydroxyalkylmethacrylamides, where alkyl is of 1 to 6 carbon atoms, eg. N-hydroxymethylacrylamide, N-hydroxymethylmethacrylamide, N-hydroxyethylacrylamide and N-hydroxyethylmethacrylamide, derivatives and reaction products of these acrylamides and methacrylamides, and, in particular, the acrylic acid esters and methacrylic acid esters of dialcohols and polyalcohols, for example the diacrylates, dimethacrylates, triacrylates and trimethacrylates of ethylene glycol, diethylene glycol, triethylene glycol, polyethylene glycol of molecular weight about 500 or less, propane-1,2-diol, propane-1,3-diol, neopentylglycol(2,2-dimethylpropanediol), butane-1,4-diol, 1,1,1-trimethylolpropane, glycerol or pentaerythritol, and the monoacrylates and monomethacrylates of such diols and polyols, for example of ethylene glycol, diethylene glycol, triethylene glycol and tetraethylene glycol. Particularly advantageous materials to use, because of their compatibility with the polymeric binder (component B1) and because they improve the resilience (in particular for flexographic printing), are low molecular weight prepolymeric urethane-acrylates, such as can be prepared, for example, by reacting hydroxyalkyl acrylates or methacrylates (eg. β-hydroxyethyl acrylate or methacrylate, β-hydroxypropyl acrylate or methacrylate), aliphatic diols (for example of the above type) and organic diisocyanates (eg. hexamethylene diisocyanate or isophorone diisocyanate). Such low molecular weight prepolymeric urethane-acrylates, which preferably have molecular weights of less than 5,000, in particular of from 500 to 3,000 are described in, for example, German Laid-Open Application No. DOS 1,644,797.

Suitable photopolymerization initiators (component B3) are the conventional compounds and systems for initiating a photopolymerization reaction on exposure to actinic light, such as have been adequately described in the relevant literature. Preferred initiators are those which are thermally inactive below 120° C., preferably below 185° C. The photoinitiators should be dispersible in the photopolymerizable layer B in the amount required to initiate the desired polymerization or cross-linking under the influence of actinic radiation.

Examples of photoinitiators are acyloins and their derivatives, such as benzoin, benzoin alkyl ethers, α-methylolbenzoin and its ethers and α-methylbenzoin, vicinal diketones and their derivatives, for example diacetyl, benzil, benzil ketals, eg. benzil dimethyl ketal, benzil methyl ethyl ketal, benzil methyl benzyl ketal, benzil methyl allyl ketal and benzil ethylene glycol monoketal, unsubstituted and substituted quinones, eg. anthraquinone and benzanthraquinone, benzophenone and 4,4'-bis-(dimethylamino)benzophenone and, in particular, acylphosphine oxide compounds of the type described in, for example, German Laid-Open Application No. DOS 2,909,992.

The photopolymerization initiators can be used individually or as mixtures with one another. The amounts used are those required to initiate the photopolymerization. Depending on the extinction coefficient of the initiator, the thickness of the photopolymerizable layer of the recording material, etc., the amount of photopolymerization initiator employed is in general from 0.02 to 5% by weight, preferably from 0.1 to 3% by weight, based on the sum of all components of the photopolymerizable layer B. The photopolymerization initiators can also be used in conjunction with other co-initiators or activators. For example, initiator systems comprising benzoin methyl ether and triphenylphosphine, or comprising 4,4'-bis-(dimethylamino)benzophenone and a halohydrocarbon (cf. German Laid-Open Application No. DOS 2,759,164) or comprising acylphosphine oxide compounds and tertiary amines, eg. methyldiethanolamine, dimethylethanolamine or triethanolamine (cf. German Laid-Open Application No. DOS 2,909,992) can be used. For such initiator systems, the total concentration of photoinitiator plus activator is from 0.05 to 8% by weight, preferably from 0.5 to 5% by weight, based on the photopolymerizable layer B.

In addition to the polymeric binder (component B1), the photopolymerizable, ethylenically unsaturated, low molecular weight compounds (component B2) and the photopolymerization initiators (component B3), the photopolymerizable layer B of the novel recording material may contain, as an additional component (B4), conventional amounts of the usual additives. These include, in particular, thermal polymerization inhibitors, inorganic or organic pigments or dyes, inorganic or organic fillers, plasticizers, dulling agents and lubricants.

Suitable polymerization inhibitors are the conventional compounds used to prevent thermal polymerization, for example hydroquinone, p-methoxyphenol, p-quinone, copper-I chloride, methylene blue, β-naphthol, phenols, m-dinitrobenzene, N-nitrosoamines, eg. N-nitrosodiphenylamine, phenothiazines, esters of phosphorous acid, eg. triphenyl phosphite, or salts, for example the potassium or aluminum salts, of N-nitroso-cyclohexylhydroxylamine. A precondition which such inhibitors have to meet is that they should not possess a significant intrinsic absorption in the actinic range in which the photoinitiator, used at the same time, absorbs. The polymerization inhibitors are in general employed in amounts of from 0.001 to 2.0% by weight, preferably from 0.005 to 0.5% by weight, based on the sum of all components of the photopolymerizable layer B. The layer B can moreover contain dyes or photochromic additives for controlling the exposure characteristics of the novel recording material. Dyes or pigments may also be added for identification purposes or aesthetic purposes, provided that they do not excessively absorb the actinic radiation and that they do not interfere with the photopolymerization reaction.

The photopolymerizable layer B can moreover contain further additives, for example compatible plasticizers, waxes, saturated low molecular weight compounds having amide groups, etc., by means of which specific properties, depending on the particular end use, can be obtained or improved. For example, the incorporation of certain amounts of plasticizers into the photopolymerizable layer B results in layers which are soft but have good resilience, so that the addition of such plasticizers is particularly advisable in the case of photopolymerizable recording materials which are to be employed, for example, for the production of flexible and resilient relief printing plates. The addition of other materials, for example certain polymers or fillers, can be used, correspondingly, to increase the hardness of the exposed layers. Suitable plasticizers are the compounds conventionally used for this purpose, for example phthalic acid esters, paraffin oils or liquid polybutadiene compounds. The photopolymerizable layer B can in general contain from 5 to 30% by weight of plasticizers, based on the sum of all components in layer B.

The resistance of the photopolymerizable recording materials to oxygen and ozone can, if necessary, be improved by adding to the photopolymerizable layer B suitable amounts of compatible conventional antioxidants and/or anti-ozone agents.

Suitable bases A for the novel photopolymerizable recording materials are the conventional bases which have sufficiently high dimensional stability. They include metal sheets made of, for example steel or aluminum, foils of copper and the like, as well as sheets of high polymers, for example of polyethylene terephthalate, polybutylene terephthalate, nylon or polycarbonate. It is also possible to use a woven or nonwoven fabric, such as a glass fiber fabric, as base A. The choice of a suitable base A depends, in particular, on the end use of the photopolymerizable recording material. For example, to produce photoresists it is preferred to use bases which are particularly easily etched or electroplated. For the production of elastomeric relief printing plates, the bases used are flexible materials having a sufficiently high modulus of elasticity. As an alternative to direct anchoring of the photopolymerizable layer B to a base A of high strength and high dimensional stability it is possible, in order to achieve greater plate thicknesses which are predetermined by rubber plates conventionally used in flexographic printing, to employ, as an underlayer for the photopolymerizable layer B, another flexible and resilient base material which in turn is firmly bonded to a dimensionally stable base. For example, flexible and resilient underlayers, as described in German Laid-Open Application No. DOS 2,444,118, can be employed for multi-layer plates.

The novel photopolymerizable recording materials are produced in a conventional manner by preparing the individual layers and bonding them together. To produce the photopolymerizable layer B, the individual components (B1), (B2) and (B3), with or without (B4), are homogeneously mixed by conventional methods and the mixture is processed into layers of the desired thickness. The homogeneous, essentially non-lightscattering mixtures of the individual components of layer B can be prepared by conventional kneading, mixing and dissolving methods. The photopolymerizable layer B can then be produced, for example, by coating the appropriate base with a solution of the mixture in a suitable solvent (for example tetrahydrofuran). The photopolymerizable layer B can also be produce by pressing, calendering or extruding the mixture, and if the inhibitors have been appropriately chosen there is no danger of incipient thermal polymerization as a result of such treatment.

As a result of the presence of the polyurethanes (Component B1) employed according to the invention, the mixtures of components of layer B, and the photopolymerizable layers produced therefrom, are very easy to handle and exhibit very good processability.

To produce the photopolymerizable recording materials, it is possible either to laminate or press a prefabricated photopolymerizable layer B onto the base A or, as mentioned, to apply a mixture of the components constituting the polymerizable layer B to the base A in a suitable manner, for example by applying a layer of a solution, thereby producing a layer B of the desired thickness on the base. The last-mentioned procedure is particularly advantageous in the case of the novel materials because of their excellent gelling characteristics.

Depending on the materials employed, it may be advantageous and necessary to anchor the photopolymerizable layer B to the base A by means of an adhesive layer, about 0.5 to 40 $\mu$m thick, which may consist of a commercial one-component or two-component adhesive, the nature of which depends on the base material and on the materials constituting the photopolymerizable layer B. Adhesives which often prove suitable include commercial reactive polyurethane-based or polychloroprene-based adhesives, a suitable amount of which can be applied, by coating or casting, to the layers to be bonded.

It is often advantageous if, in the photopolymerizable recording material, a firmly adhering thin non-tacky top layer C is applied to the surface of the photopolymerizable layer B which faces away from the base. Such a layer C preferably consists of a polymer which forms hard, non-tacky, transparent and tear-resistant films. Since the photopolymerizable recording material is exposed through this layer and the latter is removed only on subsequent development of the relief image by washing out the unexposed areas with the developer, the top layer C should consist of a polymer which is soluble in the developer. The thickness of the top layer C should be in general from about 0.1 to 20 $\mu$m, advantageously from about 0.5 to 5 $\mu$m, depending on the end use of the recording material. Examples of polymers which can be employed to produce the top layer C include soluble nylons and nylon copolymers, polyurethanes, polyvinyl alcohol and its partial esters, ethers and acetals, gelatin, polyvinylpyrrolidones, polyethylene oxides of molecular weight greater than 100,000, etc. The firmly bonded top layer C enables, for example, the negative to be placed on the recording material, for exposure, without it adhering thereto and without any bubbles of trapped air being formed; moreover, layer C prevents access of oxygen—which inhibits photopolymerization—to the photopolymerizable layer B.

It is moreover often advantageous to provide the photopolymerizable recording materials with a strippable cover sheet; the latter can be applied directly to the photopolymerizable layer B or be used together with the abovementioned firmly bonded top layer C. The cover sheet, which can consist, for example, of nylon or a polyester, such as polyethylene terephthalate or polybutylene terephthalate, and which is advantageously from about 20 to 150 $\mu$m thick, is in general peeled off before imagewise exposure of the recording material; however, if the cover sheet is sufficiently transparent, exposure can also take place through the latter, after which the sheet is peeled off prior to development of the exposed material.

Because of the special polyurethane binder (component B1) employed according to the invention, the photopolymerizable recording materials exhibit not only easy processability but also good handling characteristics. They are relatively heat-stable and can be stored satisfactorily even for prolonged periods, without the occurrence of adverse changes due to, for example, aging, embrittlement or cold flow. The photopolymerizable recording materials of the invention have very good exposure characteristics, e.g. they are easily and rapidly crosslinked, though, compared to other materials of the same type, they contain a lower proportion of photopolymerizable monomers or oligomers (component B2). Because of the good mechanical properties of the polyurethanes employed in component (B1), the novel photopolymerizable recording materials are easily processed into printing plates having the desired properties, without having to accept disadvantages in return. For example, it is easy to produce photopolymerizable recording materials whose layer B, after exposure, has a Shore A hardness (DIN 53,505) of from 50 to 95, such as is desirable, for example, for the preparation of elastomeric relief printing plates.

The photopolymerizable recording materials of the present invention are particularly suitable for photochemical information fixing by imagewise exposure of the photopolymerizable layer B and subsequent removal of the unexposed, non-crosslinked areas of the layer, especially by conventional washing-out with a developer. The thickness of the photopolymerizable layer B and the particular structure of the photopolymerizable recording material depends on the particular end use. While in general the thickness of the photopolymerizable layer B can easily be varied between 0.005 and 6.5 mm, the thickness employed for preparing photoresists, for example, is from 5 to 70 μm. For the production of relief printing plates, the thickness of the photopolymerizable layer B is generally from several 100 μm to several mm. To produce printing plates with relief-forming layers 3.0–6.5 mm thick it is also possible, for example, to produce the photopolymerizable layer B by laminating individual layers of photopolymerizable mixtures, if necessary using a solvent which dissolves the surfaces of the layers being combined. To achieve specific printing properties, layers of different hardness and different composition can be laminated. To produce relief plates for flexographic printing, recording materials having a sandwich structure as described in German Laid-Open Application No. DOS 2,444,118, ie. possessing an elastomeric, flexible and resilient underlayer and an additional stabilizing layer, can prove advantageous.

The photopolymerizable recording material can be exposed using flat-plate or rotary exposure units. Suitable sources of light which initiates the photopolymerization or photocrosslinking are commercial actinic light sources, eg. ultraviolet fluorescent tubes, medium-pressure, high-pressure and low-pressure mercury vapor lamps, superactinic fluorescent tubes, pulsed xenon lamps, metal iodide doped lamps, carbon arc lamps, etc. The light emitted by the radiation sources should have a wavelength of from 230 to 450 nm. Preferably, the wavelength should be from 300 to 420 nm or be matched to the intrinsic absorption of the photoinitiator contained in the photopolymerizable layer B.

Suitable developers for washing out the unexposed, non-crosslinked areas of layer B after imagewise exposure of the novel recording materials are alcohols or alcohol/water mixtures. Examples of alcohols are methanol, ethanol and isopropanol. The alcohol/water mixture can, for example, contain ethanol and water in a weight ratio of 8:2.

After washing out with the developer, the resulting relief plates, eg. relief printing plates or photoresists, are dried in a conventional manner, if necessary at up to 120° C. In some cases it is advantageous subsequently to post-expose the resulting relief plates to actinic light in order to increase their strength.

The printing plates produced according to the invention can be employed for all types of printing processes. The novel recording materials can be used particularly advantageously for the preparation of elastomeric printing plates suitable for applications where a resilient printing surface is required. In such cases, the photopolymeric relief-forming layer B should, after exposure, have a Shore A hardness (DIN 53,505) of 50-95, preferably of 60-90. The relief printing plates are particularly suitable for printing with oil-based inks.

Photoresists can be produced from the novel photopolymerizable recording materials, using laminating process described in, for example, German Published Application Nos. DAS 1,522,515 and DAS 2,123,702. The photoresists can be used in a conventional manner for electroplating or electroless metal coating, for etching, and for engraving, for example in the production of printed circuits, integrated circuits, silk screens, etc.

The Examples which follow illustrate the invention. Parts and percentages are by weight, unless stated otherwise. Parts by volume bear the same relation to parts by weight as the liter to the kilogram. The viscosities quoted were determined under the experimental conditions stated in each particular case.

The K values quoted were measured in 1% strength solutions in dimethylformamide. The Shore A hardness was determined according to DIN 53,505, and the elongation at break and tensile strength according to DIN 53,504. Examples of the synthesis of polyurethanes employed according to the invention as component (B'):

SYNTHESIS EXAMPLE I 400 g of polyethylene oxide (molecular weight 1,000), 32.15 g of a 70% strength acetone solution of the diacrylate of bisphenol A diglycidyl ether and 31.5 g of butane-1,4-diol are introduced into 600 g of tetrahydrofuran at room temperature. 1.1 g of dibutyl-tin dilaurate are added, after which 148.7 g of hexamethylene diisocyanate are added dropwise, the temperature of the reaction mixture increasing to about 60° C. After 90 minutes, the reaction mixture is diluted with 415 g of tetrahydrofuran, and after a further 15 minutes any NCO groups still present are deactivated by the addition of 40 g of methanol. The polyurethane obtained in this manner has a K value of 56, a tensile strength $\sigma_R$ of 11 N/mm$^2$, an elongation at break $\epsilon_D$ of 860%, and a Shore A hardness of 80.

SYNTHESIS EXAMPLE II 400 g of polyethylene oxide (molecular weight 1,000), 128 g of a 70% strength acetone solution of the diacrylate of bisphenol A diglycidyl ether and 31.5 g of butane-1,4-diol are dissolved in 660 g of tetrahydrofuran at room temperature, while stirring. 1.8 g of dibutyltin dilaurate are added, followed by the addition of 176 g of hexamethylene diisocyanate, the temperature increasing to 60° C. After 90 minutes, the reaction mixture is diluted with 540 g of tetrahydrofuran, and after a further 15 minutes any isocyanate groups still present are deactivated by the addition of 60 g of methanol. The polyurethane obtained in this manner has a K value of 44, a tensile strength $\sigma_R$ of 13.5 N/mm$^2$, an elongation at break $\epsilon_D$ of 900%, and a Shore A hardness of 79.

EXAMPLE 1

78.5 parts of a polyurethane prepared as described in Synthesis Example I, 20 parts of a prepolymeric urethanediacrylate (composed of 1 equivalent of a polyester-diol, 2 equivalents of isophorone diisocyanate and 1.3 equivalents of butanediol monoacrylate), 1.5 parts of benzil dimethyl ketal, 0.02 part of Zapon Fast Black RE (C.I. 12,195, Solvent Black 34), 0.25 part of the potassium salt of N-nitrosocyclohexylhydroxylamine and 0.025 part of sec.-butylthioanthraquinone are dissolved by stirring in tetrahydrofuran at 50° C. to give a solution of about 50% strength, and the latter is cast onto a polyester film in an amount such that after drying for one hour at 60° C. a 0.7 mm thick layer remains. The polyester film has beforehand been coated with a layer, about 2 μm thick, of a nylon. This nylon coating, which adheres to the photopolymerizable relief-forming layer, enables the polyester film to be stripped off. To anchor the photopolymerizable layer to a metal base, the latter is coated with a commercial polyurethane adhesive and applied to the free face of the photopolymerizable relief-forming layer by means of a roller.

After the polyester film has been stripped off, a photographic negative is placed on top of the plate which is then exposed imagewise for 4 minutes in a commercial flat-plate exposure unit (40 watt UV fluorescent lamps) under a plastic film serving as the vacuum frame cover. The exposed plate is then washed out for about 5 minutes in a spray washer, using a 9:1 (by volume) ethanol/water mixture, to remove the unexposed areas of the layer. The relief plate obtained is then dried for 30 minutes at 60° C., after which it is post-exposed over its entire surface for 10 minutes in the same exposure unit. The relief plate obtained, in which the relief layer has a Shore A hardness of 80, an elongation at break of 158% and a tensile strength of 10.8 N/mm$^2$, is an excellent printing plate for use with printing inks based on mineral oils. The printed copies faithfully reproduce the original, the edges being sharply defined. The printing plate has very good resilience.

EXAMPLE 2

A relief printing plate, having a 0.5 mm thick relief layer for flexographic printing using oil-based inks, is produced as follows:

A solution, of about 45%-strength in tetrahydrofuran, of 78.5 parts of a polyurethane prepared as described in Synthesis Example II, 20 parts of a prepolymeric urethane-acrylate (composed of 1 equivalent of a polyester-diol, 2 equivalents of isophorone diisocyanate and 1.3 equivalents of butanediol monoacrylate), 1.5 parts of benzil dimethyl ketal and 0.03 part of a black dye (C.I. 26,150, Solvent Black 3) is knife-coated onto a 0.125 mm thick polyester base film which has been precoated with an about 2 μm thick layer of a nylon which is soluble in aqueous alcohol, and the coating of solution is then dried for 60 minutes at 60° C. The photopolymerizable relief-forming layer obtained is applied by roller to a polyester film coated with a commercial two-component polyurethane pressure-sensitive adhesive. The plate obtained is pre-exposed for 1 second, from the rear of the plate, ie. through the base film, in the flat-plate exposure unit used in Example 1. The polyester cover sheet is then peeled off, and a photographic negative is placed on the plate which is subsequently exposed for 6 minutes in the same flat-plate exposure unit. It is then washed out for 5 minutes in a commercial brush washout machine, using a 9:1 (by volume) ethanol/water mixture as the developer solution, after which it is dried for one hour at 60° C. and post-exposed for 10 minutes. After this treatment, the relief layer has a Shore A hardness of 84, a tensile strength of 6.3 N/mm$^2$ and an elongation at break of about 56%. The relief printing plate obtained has a high resolution and a long press life.

We claim:

1. A photopolymerizable recording material comprising a base A, a photopolymerizable layer B which is soluble or at least dispersible in an alcohol or alcoholic solution, and a top layer C which is soluble in the alcohol or alcoholic solution and/or a cover sheet which can be striped off the photopolymerizable layer B, the photopolymerizable layer B comprising
   (1) a polymeric binder,
   (2) at least one photopolymerizable, ethylenically unsaturated, low molecular weight compound, and
   (3) a photopolymerization initiator,
wherein the photopolymerizable layer B contains, as the binder (component B1), a substantially linear, high molecular weight, thermoplastic polyurethane which is solid at room temperature, contains acryloyl and/or methacryloyl groups as side groups, does not possess any quaternary and/or quaternizable nitrogen atoms, and is obtained by reacting a mixture of
   (a) from 15 to 30% by weight of a diisocyanate,
   (b) from 50 to 80% by weight of at least one polyether-diol, having a molecular wieght of from 250 to 4,000 and selected from the group consisting of polyethylene glycol, polypropylene glycol and ethyleneglycol/propyleneglycol co-polycondensates or mixtures of at least 50% by weight of at least one of the said polyether-diols and up to 50% by weight of at least one further compatible polydiol,
   (c) from 0.5 to 15% by weight of a chain-extending compound which is bifunctionally reactive towards isocyanates and possesses acryloyl and/or methacryloyl groups in side branches, and
   (d) from 1 to 10% by weight of another low molecular weight chain extender, each of the above percentages of the components of the reation mixture being based on the sum of the components (a), (b), (c), and (d), and the NCO/OH plus NH molar ratio provided by the reactants being from about 0.8 to 1.3.

2. A photopolymerizable recording material as set forth in claim 1, wherein the photopolymerizable layer B also contains one or more additives selected from the group consisting of thermal polymerization inhibitors, inorganic or organic pigments or dyes, inorganic or organic fillers, plasticizers, dulling agents and lubricants.

3. A photopolymerizable recording material as set forth in claim 1, wherein the polyurethane used as component (B1) has a K value of from about 25 to 75.

4. A photopolymerizable recording material as set forth in claim 1, wherein the polyurethane used as component (B1) contains from 0.01 to 2.5% by weight, based on the weight of polyurethane, of photopolymerizable double bonds in side branches.

5. The polymerizable recording material of claim 1, wherein the low molecular weight chain extender (d) is selected from the group consisting of ethylene glycol and its condensates, butanediol, propane-1,2-diol, propane-1,3-diol, neopentylglycol, hexane-1,6-diol, decane-1,10-diol, dihydroxyethoxyhydroquinone, butenediol, dimethylolnorbornene and dimethylolcyclohexene.

6. A photopolymerizable recording material as set forth in claim 1 or 2, wherein the photopolymerizable layer B contains
   (1) from 50 to 95% by weight, based on components B1 and B2, of the polymeric binder,
   (2) from 50 to 5% by weight, based on components B1 and B2, of the photopolymerizable, ethylenically unsaturated, low molecular weight compound,
   (3) from 0.02 to 5% by weight, based on the total layer B, of the photopolymerization initiator, and
   (4) from 0 to 30% by weight, based on the total layer B, of additives.

7. A process for the production of a relief plate which comprises:
exposing a photopolymerizable layer B of a photopolymerizable recording material to actinic light through an image, and layer B being soluble or at least dispersible in an alcohol or alcohol solution, said layer B comprising
   (1) a polymeric binder,
   (2) at least one photopolymerizable ethylenically unsaturated, low molecular weight compound and
   (3) a photopolymerization initiator, wherein the photopolymerizable layer B contains, as the binder (component B1) a substantially linear, high molecular weight, thermoplastic polyurethane which is solid at room temperature, contains acryloyl and/or methacryloyl groups as side groups, does not possess any quaternary and/or quaternizable nitrogen atoms, and is obtained by reactig a mixture of (a) from 15 to 30% by weight of a diisocyanate,
(b) from 50 to 80% by weight of a polydiol consisting essentially of from 50 to 100% by weight, based on the polydiol component (b), of at least one polyether-diol, having a molecular weight of from 250 to 4,000 from the group consisting of polyethylene glycol, polypropylene glycol and ethyleneglycol/propylene glycol co-polycondensates, and from 0 to 50% by weight, based on the polydiol component (b), of at least one further compatible polydiol.
(c) from 0.5 to 15% by weight of a chain-extending compound which is bifunctionally reacting towards isocyanates and possesses acryloyl and/or methacryloyl groups in side branches, and
(d) from 1 to 10% by weight of another low molecular weight extender, each of the above percentages of the components of the reaction mixture being based on the sum of the components (a), (b), (c), and (d), and the NCO/OH plus NH molar ratio provided by the reactants being from about 0.8 to 1.3;

washing out the unexposed, non-crosslinked areas of the photopolymerizable layer B with a developer, and thereafter drying the resulting relief plate.

8. A process for producing a relief plate as set forth in claim 7, wherein the polyurethane used as component (B1) has a K value of from about 25 to 75.

9. A process for producing a relief plate as set forth in claim 7, wherein the polyurethane used as component (B1) contains from 0.01 to 2.5% by weight, based on the weight of polyurethane, of photopolymerizable double bonds in side branches.

10. A process for producing a relief plate as set forth in claim 7, wherein the photopolymerizable layer B contains
(1) from 50 to 95% by weight, based on components B1 and B2, of the polymeric binder,
(2) from 50 to 5% by weight, based on components B1 and B2, of the photopolymerizable, ethylenically unsaturated, low molecular weight compound,
(3) from 0.02 to 5% by weight, based on the total layer B, of the photopolymerization initiator, and
(4) from 0 to 30% by weight, based on the total layer B, of additives.

11. The process of claim 7, wherein the low molecular weight chain extender (d) is selected from the group consisting of ethylene glycol and its condensates, butanediol, propane-1,2-diol, propane-1,3-diol, neopentylglycol, hexane-1,6-diol, decane-1,10-diol, dihydroxyethoxyhydroquinone, butenediol, dimethylolnorbornene and dimethylolcyclohexene.

12. A photopolymerizable recording material for the production of elastomeric relief printing plates, comprising a base A wherein said base is a metal or highpolymer sheet and a photopolymerizable layer B which is soluble or at least dispersible in an alcohol or alcoholic solution and comprises
(1) a polymeric binder,
(2) at least one photopolymerizable ethylenically usaturated, low molecular weight compound and
(3) a photopolymerization initiator, wherein the photopolymerizable layer B contains, as the binder (component B1) a substantially linear, high molecular weight, thermoplastic polyurethane which is solid at room temperature, contains acryloyl and/or methacryloyl groups as side groups, does not possess any quaternary and/or quaternizable nitrogen atoms, and is obtained by reacting a mixture of (a) from 15 to 30% by weight of a diisocyanate,
(b) from 50 to 80% by weight of a polydiol consisting essentially of from 50 to 100% by weight, based on the polydiol component (b), of at least one polyether-diol, having a molecular weight of from 250 to 4,000 from the group consisting of polyethylene glycol, polypropylene glycol and ethyleneglycol/propylene glycol co-polycondensates, or mixtures of at least 50% by weight of at least one of the said polyether-diols and up to 50% by weight of at least one further compatible polydiol,
(c) from 0.5 to 15% by weight of a chain-extending compound which is bifunctionally reactive towards isocyanates and possesses acryloyl and/or methacryloyl groups in side branches, and
(d) from 1 to 10% by weight of another low molecular weight chain extender, each of the above percentages of the components of the reaction mixture being based on the sum of the components (a), (b), (c), and (d), and the NCO/OH plus NH molar ratio provided by the reactants being from about 0.8 to 1.3.

13. The photopolymerizable recording material of claim 12, wherein the low molecular weight chain extender (d) is selected from the group consisting of ethylene glycol and its condensates, butanediol, propane-1,2-diol, propane-1,3-diol, neopentylglycol, hexane-1,6-diol, decane-1,10-diol, dihydroxyethoxyhydroquinone, butenediol, dimethylolnorbornene and dimethylolcyclohexane.

* * * * *

UNITED STATES PATENT AND TRADEMARK OFFICE
CERTIFICATE OF CORRECTION

PATENT NO. : 4,590,144

DATED : May 20, 1986

INVENTOR(S) : Schornick et al.

It is certified that error appears in the above-identified patent and that said Letters Patent is hereby corrected as shown below:

On front page of Patent:

Foreign Application Priority Data date should be:

August 11, 1981 not [August 18, 1981]

In the Claims:

Column 18, line 16 [usatured] should be unsaturated

Signed and Sealed this

Second Day of December, 1986

Attest:

DONALD J. QUIGG

Attesting Officer

Commissioner of Patents and Trademarks